United States Patent
Wegmann et al.

[11] Patent Number: 5,277,938
[45] Date of Patent: Jan. 11, 1994

[54] METHOD FOR CONTROLLING EVAPORATION FOR VAPOR DEPOSITION

[75] Inventors: Urs Wegmann, Oberschan; Albert Koller, Azmoos, both of Switzerland; Josef Vogt, Balzers, Liechtenstein

[73] Assignee: Balzers Aktiengesellschaft, Balzers, Liechtenstein

[21] Appl. No.: 753,745

[22] Filed: Sep. 3, 1991

[30] Foreign Application Priority Data

Sep. 11, 1990 [DE] Fed. Rep. of Germany ....... 4028842

[51] Int. Cl.[5] ............ B05D 3/06; C23C 16/00; B23K 15/00
[52] U.S. Cl. .................. 427/566; 427/597; 427/248.1; 219/121.15
[58] Field of Search ............ 427/42, 566, 567, 596, 427/597, 248.1; 219/121.15, 121.17, 121.38

[56] References Cited

U.S. PATENT DOCUMENTS

| | | | |
|---|---|---|---|
| 3,432,335 | 3/1969 | Schiller et al. | 427/42 |
| 3,453,143 | 7/1969 | Meixner et al. | 427/42 |
| 3,526,206 | 9/1970 | Jones | 219/121.15 |
| 3,645,786 | 2/1972 | Tannenberger et al. | 427/42 |
| 3,655,430 | 4/1972 | Greaves | 427/42 |
| 3,710,072 | 1/1973 | Shrader et al. | 219/121 EB |
| 4,000,428 | 12/1976 | James et al. | 219/121 EB |
| 4,230,739 | 10/1980 | Aichert et al. | 427/42 |
| 4,958,059 | 9/1990 | Lizee | 219/121.15 |
| 4,973,818 | 11/1990 | Bittenbrünn et al. | 219/121.17 |
| 5,132,506 | 7/1992 | Shintaku et al. | 219/121.15 |

FOREIGN PATENT DOCUMENTS

| | | |
|---|---|---|
| 3330092 | 3/1985 | Fed. Rep. of Germany . |
| 959213 | 5/1961 | United Kingdom . |

OTHER PUBLICATIONS

French Search Report Jan. 15, 1993 in FR 9111219.

*Primary Examiner*—Marianne Padgett
*Attorney, Agent, or Firm*—Notaro & Michalos

[57] ABSTRACT

The invention relates to a method and an apparatus by means of which a material is vaporized in a treatment chamber by means of an electron beam. Due to controlling the inhomogenity of power distribution over the working area of the beam it becomes possible to prevent local overheating of the target material and thus of a deformation of the target surface. This is realized by oscillating the beam around its working point. The amplitude of the oscillation is, thereby, of almost a few beam diameters and this oscillation is superimposed on the momentarily working position of the beam on the target.

12 Claims, 2 Drawing Sheets

METHOD FOR CONTROLLING EVAPORATION FOR VAPOR DEPOSITION

BACKGROUND OF THE INVENTION

1. Field of the Invention

The present invention relates to a method of controlling the density and/or distribution of a vapor deposition flow of a material vaporized from a vaporization object by a beam of electrons in a treatment chamber.

It also relates to an arrangement for a controlling of the density of the vapor deposition flow and/or its distribution in a treatment chamber of a material vaporized from a vaporization object by means of a beam of electrons.

2. Description of the Prior Art

Throughout the description we use the following definitions:

- vapor flow: the amount of evaporated material passing per time unit across a surface area
- vapor flow density: vapor flow passing across a unit of area
- vapor flow density distribution: the characteristic of vapor flow densities considered in two dimensions over a surface area
- standardized distribution: the distribution characteristic normalized by the maximum density occurring along the surface area considered
- power density: power per unit area
- power density distribution: power density characteristic considered in two dimensions over a surface area
- temperature distribution: temperature characteristic considered in two dimensions over a surface area
- evaporation rate: amount of material evaporated per time unit
- deposition vapor flow: vapor flow which is deposited on a desired surface area The standard power density distribution $p/p_{max}$ of a beam of electrons used for the evaporating of a material, usually termed target, is substantially bell-shaped such as illustrated in FIG. 1.

At a model beam $S_m$ of an assumed homogeneous, standardized power density distribution $p/p_{max}$ the standardized temperature distribution $\theta/\theta_{max}$ is also substantially bell-shaped in the vaporization area acted upon by the beam, specifically due to the diffusion of the heat, such as illustrated FIG. 2a. Accordingly, in when regarding the power density as not being homogeneously distributed, as for a real beam according to FIG. 1 where distribution is quite pronounced, peripherically decreasing standardized temperature distribution is produced such as illustrated in FIG. 2b with a pronounced temperature peak at the center area of the vaporization surface.

Apart from a high thermal loading of the material being vaporized, i.e. of the target material, this leads among others at a high beam power to deformations of the vaporization surface (target surface) such as shown in "Elektronenstrahltechnologie", S. Schiller et al., Wissenschaftliche Verlagsgesellschaft mbH, Stuttgart, 1977, page 174. (Schiller) If the beam power is changed at a fixed, standardized distribution of the power density, the rate of evaporation, defined as the amount of material vaporized per unit of time from the vaporization object, runs through a pronounced maximum such as illustrated in Schiller on page 173.

The vapor flow which spreads from the area of impingement of the beam of electrons leads in the treatment space, considered locally, to varying densities of the vapor flow.

From the standardized power density distribution of the beam, the power of the beam, and depending on standardized density distributions of vapor flow result, in the treatment space such as disclosed, for example in the mentioned book, at page 142.

The occurrence of spatters at too high a beam power and at a given standardized density distribution is one of the limits to the evaporation-rate. Further increase in the evaporation-rate would be desirable, however, to increase the economics of such process. A second corresponding limit is to the co-changing of the density distribution of the vapor flow. See, for example, Schiller, page 142.

There is an inherent need to increase the density of the vapor flow in order to increase productivity, whereas the selection of an optimal distribution of vapor flow density depends on the type of deposition process, such as for instance how workpieces to be coated by electron beam vaporization are positioned in the treatment space or which coating profile is desired.

Without the above mentioned limits it thus would be possible to increase productivity by an increase in the evaporation rate or, an increase of vapor flow at the coating location or locally, an increase in the density of vapor flow. This would result from an increase of the power of the electron beam acting on the evaporation surface area.

The quality of the coating and the productivity of a plant, as well, could be further increased by aimed optimizing of the distribution of vapor flow density (exploitation of space!). Because the maximum of the evaporation rate does not generally occur at the same beam power (at a standardized distribution of power density which is kept constant) as a process specific, desired distribution of vapor flow, it would be desirable to optimize either the density of deposition vapor flew or the deposition vapor flow density, or to design the deposition vapor flow density and the deposition vapor flow density distribution specific to a given plant, optimally considering economic aspects.

SUMMARY OF THE INVENTION

It is, therefore, a general object for the invention to provide a procedure of increasing the beam power which can act upon a given evaporation surface area, and to thereby also adjust or set the vapor flow density distribution and thereby to bypass the above mentioned known limits, i.e. without incurring thermal overloading of the evaporation object and without causing surface deformations and occurrence of spatters.

A further object is to provide a method of controlling at least one of the density of deposition vapor flow and of the distribution thereof, of a material vaporized from an evaporation object by an electron beam, in a treatment space, comprising the steps of controlling by means of a selected oscillating said electron beam on the evaporation object in at least one direction about a momentary working position the power density distribution of the beam, averaged over time in an area around the working position.

Yet a further object is to provide an arrangement for controlling at least one of the deposition vapor flow density and of the distribution thereof of material vaporized by means of an electron beam from an evaporation object within a treatment chamber, which includes means for deflecting the electron beam and having at least one control input; a modulator unit allocated to said control input, at which at least one of modulation frequency, modulation degree shape of modulation characteristic is or are, adjustable or pre-settable.

While it is known as such to change in a controlled manner the location of the area of impingement of an electron beam on the surface of the evaporation object in order to successively vaporize the surface thereof, the present description distinctly makes reference to this known, controlled changing of the location in the sense of a large-signal control, i.e. of a control of the working point.

Contrary to this, the inventively applied oscillation of the location of the impingement area is realized, in magnitudes of at the most a few diameters of the impingement area and is to be considered under the aspect of small signal behaviour of the impingement surface, i.e. it is superimposed over the respective dynamically changing working point.

BRIEF DESCRIPTION OF THE DRAWINGS

The invention will be better understood and objects other than those set forth above will become apparent when consideration is given to the following detailed description thereof. Such description makes reference to the annexed drawings, wherein.

DESCRIPTION OF THE PREFERRED EMBODIMENTS

Figure 1:
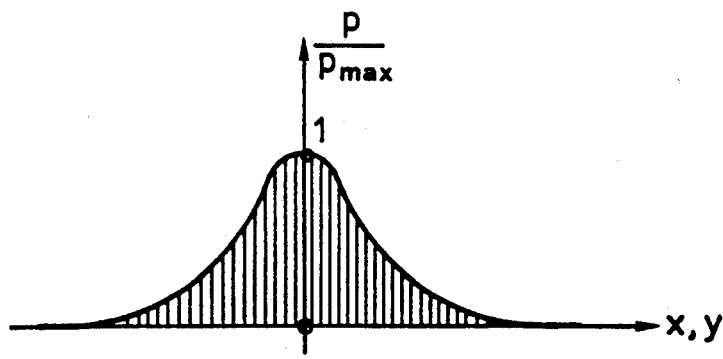
FIG. 1 is a qualitatively plotted graph showing a standard power density distribution of an electron beam as used for evaporating a material.
Figure 2A:
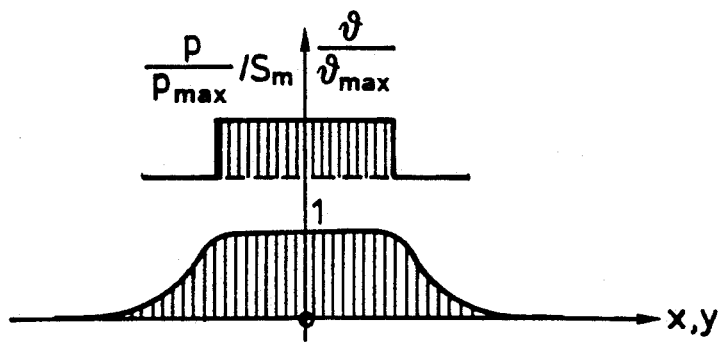
FIG. 2a is a qualitatively plotted graph showing a standardized power density distribution of an assumed "model" beam and the standardized temperature distribution which would result from such "model" beam along the impinging area acted upon by such beam.
Figure 2B:
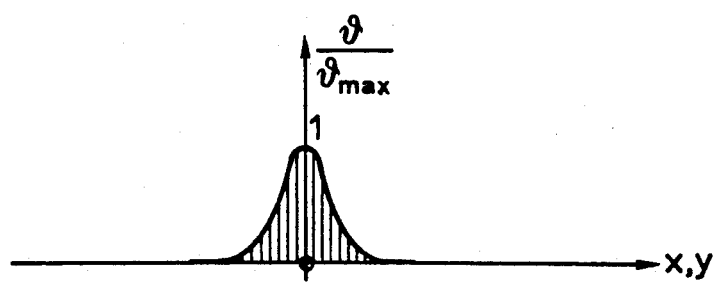
FIG. 2b is a graph showing a standardized temperature distribution in the impinging, i.e. vaporization area acted upon by a real electron beam with a standardized power density distribution according to FIG. 1.
Figure 3:
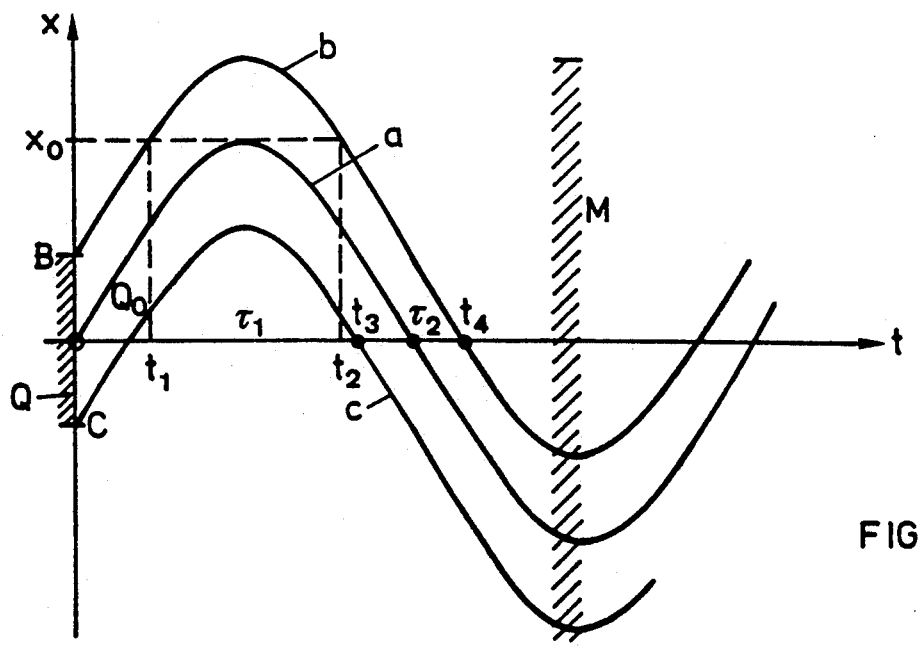
FIG. 3 illustrates for the explanation of the inventive procedure, an x-position coordinate of the area of impingement of an electron beam oscillating in accordance with the invention, relative to the time axis t.

In FIG. 3, as an example in x-direction, the extent of the area Q of impingement corresponding to the electron beams diameters is shown in relation to time t, where the zero-point is selected to be a working point of the area of impingement and within the surface of impingement. In accordance with the invention the position of the area Q of impingement is oscillated about the momentary working point, i.e. here, the zero-position of the x-coordinate.

For sake of simplicity and as an example, this is shown in FIG. 3 by a sinusoidal position-modulation.

The central point $Q_0$ of the impingement area Q is oscillatingly moved along the curve "a". The boundary points (viewed in the x-direction) B, C of the idealized, sharply bordered electron beam impingement area Q, move along curves "b" and "c".

If now a location $X_0$ is considered on the x-coordinate, for instance corresponding to the amplitude of the oscillation of the central point $Q_0$ of the area of impingement, it is obvious that the upper boundary point B of the area Q passes this location $X_0$ at moment $t_1$ and that thereafter, until this point B passes again this location $X_0$, at the time $t_2$, the location point $X_0$ is kept within the area Q of impingement of the beam.

If now, in contrast thereto, for instance the location of the working point corresponding to x=0 is considered, it becomes clear, that the lower boundary point C of the area Q of impingement arrives the first time at this working point location at the moment $t_3$ and that the upper boundary point B of the area Q of impingement leaves this location at the moment $t_4$.

Accordingly, the point of the location $X_0$ is exposed to the electron beam during the time span $\tau_1$ between the moments $t_1$ and $t_2$, which time span $\tau_1$ is considerably larger than the time span $\tau_2$ between, the moments $t_3$ and $t_4$, during which the working point of the beam is exposed to the electron beam working.

It is now evident, that the density of the beam power, averaged over the time, to which a location, such as $X_0$, of the evaporation surface of the area Q of impingement of the beam is exposed, depends on its relative position with respect to the momentary beam working point and, from the amplitude of the oscillation, as well as from the shape of the curve of the modulation characteristic of the position of the area Q of impingement.

Until now reference was made to the momentary impinging area Q of the beam. By means of the procedure according to the invention, however, a momentary processed area is realized, which, as shown in FIG. 3 by M, has a power density distribution, averaged over time can be selected by selecting the shape of the curve of the modulating characteristic which is, as an example, a sinusoidal curve according to FIG. 3. It must, thereby, be taken into consideration that the material to be evaporized has a thermal inertia which is specific to the material. The material acts to average the power over time in view of the rather high modulation frequencies, thus as a low-pass-filter element, so as the momentary worked e.g. evaporized surface is to be considered as a unitary beam impingement surface, however, now with a selected power density distribution therealong. This enlarged working surface area is shown at M of FIG. 3.

The unitary area is actually a simultaneously evaporated area which is enlarged by movement of the impinging area of the electron beam on the substrate, in a manner and at a rate of movement for maintaining evaporation of all material at the surface of the enlarged simultaneously evaporated area.

Quite obviously, the procedure illustrated with help of FIG. 3 is executed possibly in two dimensions, i.e. the beam is oscillated on the evaporation surface in two directions which extend perpendicularly to each other. By selection of the respective modulations in the x- and the y-directions according to principle of Lissajoux-figures, the desired pattern of modulation is set.

Figure 4:
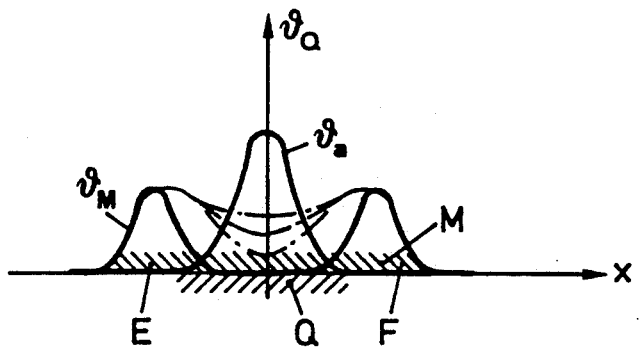
FIG. 4 illustrates qualitatively an assumed distribution of temperature at the vaporization object and in the area of the impinging of the electron beam, when the electron beam, is kept stationary $\theta_a$, and, $\theta_m$, is inventively oscillating according to FIG. 3, the x-coordinate being selected parallel to the impingement area.

FIG. 4 illustrates on a purely qualitative basis the temperature distribution $\theta_a$ at a vaporization object acted upon in a known way stationarily by an electron beam, which temperature distribution $\theta_a$ is shown over the exemplary designed x-coordinate.

If now the beam, such as explained with reference to FIG. 3, is oscillated with a selected shape of movement of time; the resulting distribution of temperature $\theta_M$ is controlled via the control of distribution of power density. Accordingly, due to the increase of the power densities at border areas of the resulting evaporated area M around the working point, temperature increases E and F are produced at these border areas of the said area M due to the sine-shaped modulation according to FIG. 3, and therebetween a temperature distribution such as illustrated by dash-dotted lines occurs in the impinging area Q.

This temperature distribution $\theta_M$ is determined according to the material to be evaporated substantially by the shape of the modulation curve and the fundamental frequency of the modulation. Accordingly, it is possible to use depending from prevailing conditions beside sine-shaped forms of the modulation curve also triangular courses, saw-tooth courses, courses with shapes of parabola-branches or others, and all in a one- or two-dimensional fashion.

By the inventively realized oscillation of the beam impingement area Q on the object to be evaporized it has now become possible to achieve at a given high beam and accordingly high evaporation power and at a given place of a treatment chamber a desired high density of vapor flow, or an optimal vapor deposition efficiency, in the sense of a ratio between supplied beam power to gained vapor deposition effect, or, in a given configuration of the equipment used, an optimal distribution of vapor flow density can be achieved.

In practice an optimal operation is set taking into account the density of vapor flow, the efficiency and of the distribution of the density of vapor flow. It is, furthermore, possible to keep thereby the thermal loading of the vaporization material low, in the sense of low thermal gradients.

Figure 5:
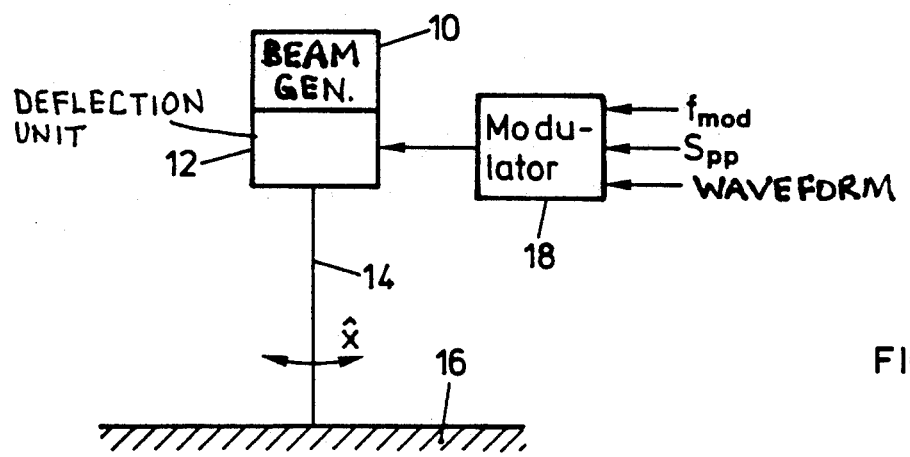
FIG. 5 illustrates schematically in form of a block diagram an inventive beam control for a linearly propagating electron beam.

FIG. 5 illustrates schematically an inventive control arrangement for an electron beam 14. A controllable electron optics provided as a deflecting unit 12 is arranged downstream a beam generator 10. This deflecting unit 12 can, for instance, operate on the basis of the deflecting effect of magnetic fields onto moving electrons. In order to realize the desired oscillating movement of the linear electron beam 14 on the evaporation object 16 in a selected manner, a modulator unit 18 is connected to the deflecting unit 12, at which modulator unit 18 the modulation frequency $f_{mod}$, the modulation amplitude $s_{pp}$ and, the shape of the modulating curve can be input, corresponding to the respective requirements, especially corresponding to the respective material of the vaporization object 16.

Figure 6:
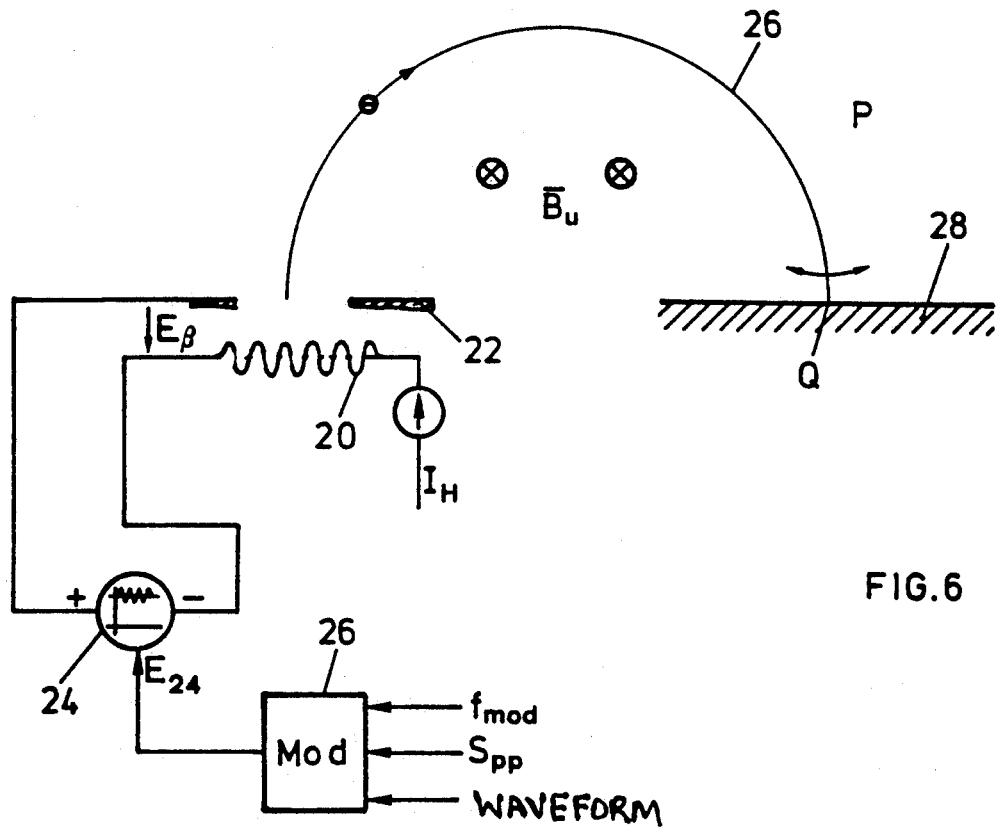
FIG. 6 illustrates a preferred inventive control for a deflected electron beam.

FIG. 6 illustrates schematically a preferred realization of an inventive control arrangement with vapor deposition chamber and equipment.

Electrons are thermally emitted from an electron-emission cathode 20 illustrated herein as a cathode filament heated directly by a heating current $I_H$. An anode 22 in the form of an orifice plate is located above the cathode 20. An acceleration voltage generator 24 is provided between the cathode 20 and the anode 22, whereby (not illustrated the cathode side or the anode side can be connected to a reference potential, such as to ground potential.

The electron beam 26 accelerated by the acceleration field $E_b$ is deflected by a magnetic deflection field $B_u$ by at least 90°, preferably by 180° to 270°, and impinges finally onto the one surface of the vaporization object 28.

By means of the magnetic deflection field $B_u$, i.e. by means of its modulation it is now possible to modulate in a first inventive embodiment the extent of deflection of the beam 26 and accordingly the location of the area of impingement at the object 28 to be evaporated. By this procedure it must be borne in mind that at the one side usually shifting of the working point (large signal control) of the electron beam is made by means of that deflection field $B_u$ and that it can be desirable to provide for the (small signal) control of the inventive oscillation a control value which is independent from $B_u$.

Secondly, it must be borne in mind that electromagnet arrangements for the generation of the deflection field with an oscillating component of field have relatively low cutoff-frequencies, wherewith this procedure —modulation of $B_u$—is suitable for lower modulation frequencies.

Further an oscillating deflection leads to a not always neglectable modulation of the beam-focus.

Taking these mentioned restrictions into consideration, preferably the acceleration voltage between the anode 22 and the cathode 20 is modulated, as will be explained later, in addition to or in place of a modulation of the deflection field. Hereto and as schematically illustrated, the acceleration voltage generator 24 is modulated about a direct voltage value, for instance of 10 KV, for instance at an amplitude up to several 100 V.

The modulation of the acceleration voltage can proceed up to substantially higher frequencies than the modulation of the deflection magnetic field. Whereas the modulation by means of a magnetic deflection field has a cutoff frequency of some 10 Hz, this cutoff-frequency amounts at the acceleration voltage modulation to several kHz.

If now, however, the area of impingement of the electron beam is to be moved oscillatingly in two directions, this is preferably realized in the one direction by means of the mentioned acceleration voltage, in the other direction electro-magnetically.

In order to modulate the acceleration voltage between anode and cathode a modulation control input $E_{24}$ is foreseen at the acceleration voltage generator 24, to which a modulator 26 is connected, at which again the frequency of modulation, the amplitude or shape of curve, of the modulation is inputted, the shapes of the characteristic curve for instance stored and preselectable by loading into an EPROM.

It has been recognized, that the modulation of the acceleration voltage, preferably between anode and cathode, has a relatively small influence onto the extent of the area Q of impingement in the sense of a focussing or defocussing of the beam, and that thus and as desired a control value is found, specifically for the inventive modulation which is independent from further control values, such as from the deflection field $B_u$ or from a lateral deflection field for the respective working position of the electron beam 26.

The same principal procedure, i.e. modulation of the acceleration voltage, preferably between anode 22 and cathode 20, can also be realized by a rectangular modulation or a stair-case modulation, wherewith high boundary temperature peaks are achieved at the vaporization surface M or, in case of a stair-case modulation, a plurality of such peaks, and wherewith, in an extreme case a double or multiple evaporation area source is realized by one single electron beam.

It is, furthermore, also possible to modulate the modulation of mentioned acceleration voltage for the electron beam square shaped between an "ON"-value and an "OFF"-value for the beam.

The modulation applied in accordance with the invention can be used, furthermore, for a lock-in-detection method in that a detector for the vapor flow tuned selectively to the frequency of the modulation is forseen in the treatment space such as indicated in FIG. 6 by P, by means of which the vapor flow can be measured and specifically independently from background disturbances or noise and also, if needed, independent from a further material for deposition process for the workpiece as of co-evaporation at a different frequency, of a co-sputtering etc.

When selecting the frequency of the modulation; the amplitude and/or shape of the characteristic curve of the modulation, it is necessary, such as mentioned, to take the size of the vaporization object, or target and also its thermal behaviour within the cooled support into consideration. The impingement area must be moved as a function of the thermal inertia of the target or object being evaporated so that the impingement area is enlarged.

In addition to the described oscillation of the impingement position of the beam, the distribution of power density can also be influenced by pulse duration modulation of the beam power, by a respective power/time-modulation or energy/time-modulation.

While there are shown and described present preferred embodiments of the invention, it is distinctly understood that the invention is not limited thereto, but may be otherwise variously embodied and practiced within the scope of the following claims.

We claim:

1. A method of evaporating material from a surface of an object in a treatment chamber for vapor deposition, the method comprising the steps of:
   directing an electron beam onto the surface to evaporate the material, the electron beam defining an impinging area on the surface of the object, the impinging area having a diameter and forming a simultaneously evaporated area of the material where all material at the surface of the simultaneously evaporated area is being evaporated; and
   moving the impinging area in an oscillating manner across the surface of the object and within a locus of movement, at a rate of movement so as to enlarge the simultaneously evaporated area while maintaining evaporation of all material at the surface of the enlarged simultaneously evaporated area.

2. The method of claim 1 wherein the electron beam has a power, the method including raising the power of the electron beam to a level that if the impinging area were not moved, across the surface, the object would experience at least one of spatters, deformation and thermal overload, the moving of the impinging area preventing spatters, deformations and thermal overload despite the raising of the power of the electron beam.

3. The method according to claim 1, wherein the impinging area is moved in the oscillating manner at an amplitude, the amplitude comprising at most, a few diameters of the impinging area.

4. The method of claim 1, wherein the locus of movement of the impinging area has a shape to provide a required distribution of vapor flow density from the enlarged simultaneously evaporated area.

5. The method of claim 1, including generating the electron beam at an electron beam generator, accelerating the electron beam from the electron beam generator at an acceleration voltage, deflecting the electron beam by at least 90° as it moves from the electron beam generator to the impinging area so that the electron beam propagates along a bent projectory, and moving the impinging area in the oscillating manner by modulating the acceleration voltage.

6. The method of claim 5, wherein the electron beam generator comprises an emission cathode for generating electrons and an anode for forming the electrons into the electron beam, the acceleration voltage being applied between the cathode and the anode, the acceleration voltage being modulated for moving the impinging area.

7. The method of claim 5, wherein the oscillating manner of movement for the impinging area has an amplitude of, at most, a few diameters of the impinging area.

8. The method of claim 1, including applying a magnetic field to the electron beam for deflecting the electron beam before it reaches the impinging area, and moving the impinging area by modulating the magnetic field.

9. The method of claim 1, wherein the locus of movement includes at least one of a square wave and staircase wave modulation, which changes over time, to form the enlarged simultaneously evaporated area which includes the at least two sub-areas where material is evaporated at the same time.

10. The method of claim 1, wherein the electron beam has a power, the method including oscillating the power of the electron beam in addition to said moving of the impinging area.

11. The method of claim 1, including moving the impinging area within the locus of movement at a rate so that the locus of movement is substantially equal to the enlarged simultaneously evaporated area.

12. The method of claim 1, wherein the impinging area is moved in the oscillating manner at a frequency, the method including detecting vapor flow from the enlarged simultaneously evaporated area using a detector which is tuned to said frequency of movement of the impinging area.

* * * * *